United States Patent
Kikuchi et al.

[11] Patent Number: 5,741,988
[45] Date of Patent: Apr. 21, 1998

[54] LEAD FRAME DETECTION APPARATUS

[75] Inventors: Eiji Kikuchi, Musashi-Murayama; Takashi Kobayashi, Akiruno, both of Japan

[73] Assignee: Kabushiki Kaisha Shinkawa, Tokyo, Japan

[21] Appl. No.: 933,235

[22] Filed: Sep. 18, 1997

Related U.S. Application Data

[63] Continuation of Ser. No. 662,929, Jun. 13, 1996, abandoned.

[30] Foreign Application Priority Data

Jun. 14, 1995 [JP] Japan .................... 7-170482

[51] Int. Cl.⁶ ............................................ G01M 19/00
[52] U.S. Cl. .................... 73/865.8; 340/674; 198/340
[58] Field of Search ...................... 73/865.8, 865.9, 73/866.5; 340/673–676; 198/339.1, 340, 341; 33/559, 556; 414/222

[56] References Cited

U.S. PATENT DOCUMENTS

| | | | |
|---|---|---|---|
| 4,476,743 | 10/1984 | Kimura | 414/128 |
| 5,041,721 | 8/1991 | Smith et al. | 235/462 |
| 5,208,464 | 5/1993 | Yonemoto et al. | 250/561 |
| 5,220,997 | 6/1993 | Ushiki et al. | 414/19 |
| 5,474,228 | 12/1995 | Sato | 228/180.21 |
| 5,562,382 | 10/1996 | Miyoshi | 414/222 |

FOREIGN PATENT DOCUMENTS

| | | | |
|---|---|---|---|
| 53-116082 | 8/1977 | Japan . | |
| 55-12747 | 1/1980 | Japan | H01L 21/500 |
| 2-22987 | 6/1990 | Japan | H01L 21/52 |
| 8171624 | 7/1996 | Japan . | |

OTHER PUBLICATIONS

Translation of Abstract JP 55-12747.

*Primary Examiner*—Hezron E. Williams
*Assistant Examiner*—Nashmiya Fayyaz
*Attorney, Agent, or Firm*—Koda and Androlia

[57] ABSTRACT

In a lead frame detection device used between a bonding machine and a lead frame storage magazine, a lead frame contacting probe is provided on a pivotal contact assembly so that the pivotal movement of the contact assembly that is caused, via the contacting probe, by the thickness of the lead frame(s) is detected by sensors, thus determining the existence or absence of the lead frame(s) on the lead frame guide rails, and, in the case of existence, the number of lead frames on the guide rails.

2 Claims, 2 Drawing Sheets

LEAD FRAME DETECTION APPARATUS

This application is a continuation of application Ser. No. 08/662,929, filed Jun. 13, 1996, now abandoned.

BACKGROUND OF THE INVENTION

1. Field of the Invention

The present invention relates to a device for detecting lead frames which are conveyed on guide rails.

2. Prior Art

In die bonding performed on, for example, lead frames, lead frames stacked in a lead frame magazine are chucked and separated from other lead frames one at a time by a vacuum chucking head and then placed on lead frame guide rails so that they are transferred to a bonding machine. The lead frames placed on the lead frame guide rails are conveyed to the bonding area of the bonding machine by a pusher or feeding pawls while being guided by guide grooves formed in the lead frame guide rails.

However, when the lead frames are removed from the lead frame magazine by the vacuum chucking head, it occasionally happens that the lead frames stick together as a result of flash, etc. left on, for example, the edge of the lead frames. If this happens, the lead frames fail to separate, being stuck together, thus causing trouble in the bonding machine.

In conventional lead frame transfer devices, therefore, a contact is used in order to solve the problems. The contact is moved up and down in the lead frame conveying path of the lead frame guide rails so that the separation of the lead frames (or absence of such separation) is detected based on the differences in the amount of movement of the contact. Lead frame detection devices of this type are disclosed in, for example, Japanese Patent Application Laid-Open (Kokai) No. 55-12747, Japanese Utility Model Application Laid-Open (Kokai) No. 53-116082, and Japanese Utility Model Application Publication (Kokoku) No. 2-229887.

In these prior arts, as mentioned above, the contact is raised and lowered in the conveying path of the lead frames. Accordingly, whether or not the lead frames are stuck together cannot be detected unless the lead frames are conveyed a certain distance, namely, up to a position beneath the contact. Also, if the lead frame transfer device is stopped as a result of detection of two lead frames being conveyed together, it is necessary to horizontally pull the lead frames located beneath the contact along the lead frame guide rails so as to remove the lead frames from the lead frame guide rails. This is, however, not done easily.

SUMMARY OF THE INVENTION

Accordingly, a primary object of the present invention is to provide a lead frame detection device which can detect the separation (or absence of such separation) of two or more lead frames which have been chucked and moved by a vacuum chucking head onto lead frame guide rails without feeding the lead frames along the lead frame guide rails.

Another object of the present invention is to provide a lead frame detection device in which the lead frames can be quickly removed when two or more lead frames exist on the lead frame guide rails.

The objects described above are accomplished by a unique structure of the present invention which is used in a lead frame detection device that includes a contact assembly, which is installed so as to be pressed against the surface of one of two guide grooves of the lead frame guide rails, and a sensor, which detects differences in the amount of movement of the contact assembly, and the unique structure of the present invention is that a contacting part of the contact assembly which comes into contact with the guide groove of one of two guide rails is installed so as to advance to above the guide groove from the outside of the transfer path of the guide rails and to withdraw from the advanced point.

The above objects are accomplished by another unique structure of the present invention for a lead frame detection device that includes a contact assembly, which is pressed against the surface of one of two guide grooves of the lead frame guide rails, and a sensor, which detects differences in the amount of movement of the contact assembly, and the unique structure of the present invention is that the lead frame detection device further includes:

- a sliding table which is installed outside the guide groove of one of two lead frame guide rails so that the sliding table can move in a direction perpendicular to the length-wise direction of the guide groove, and
- a driving means which can cause the sliding table to advance to and withdraw from the guide groove, and in which the contact assembly is provided on the sliding table so as to pivot on a supporting shaft, thus pressing against the guide groove, and an area of the lead frame guide rail that is contacted by the guide groove contacting part of the contact assembly is formed on the same horizontal plane as the guide groove.

With the structure above, when a lead frame is placed on the lead frame guide rails, the guide groove contacting part of the contact assembly is moved above the guide groove. Since there is a lead frame in the guide groove, the guide groove contacting part is pushed upward by the lead frame. The amount of upward movement of the guide groove contacting part varies depending upon the existence or non-existence of the lead frame. In other words, when there is no lead frame in the guide groove, there is no upward movement of the guide groove contacting part; when there is one lead frame, there is an upward movement of the guide groove contacting part that corresponds to the thickness of the lead frame; and if there are two or three lead frames in the guide groove, the guide groove contacting part makes a larger upward movement accordingly. These differences in the amount of movement are detected by a sensor. When the lead frame detection is over, the guide groove contacting part of the contact assembly is withdrawn from the guide groove of the guide rail.

BRIEF DESCRIPTION OF THE DRAWINGS

FIG. 1 illustrates one embodiment of the lead frame detection device of the present invention which is in the waiting position, wherein FIG. 1a is a top view, FIG. 1b is a front view, and FIG. 1c is a right side view;

FIG. 2 illustrates the detection device in the detection position in the embodiment shown in FIG. 1, wherein FIG. 2a is a top view, FIG. 2b is a front view, and FIG. 2c is a right side view and wherein no lead frame has been moved onto the lead frame guide rails; and FIG. 3 illustrates the detection device in the detection position in the embodiment shown in FIG. 1, wherein FIG. 3a is a side view in which a single lead frame is present on the lead frame guide rails, and FIG. 3b is a side view in which two lead frames are present on the lead frame guide rails.

DETAILED DESCRIPTION OF THE PREFERRED EMBODIMENTS

Figure 2:
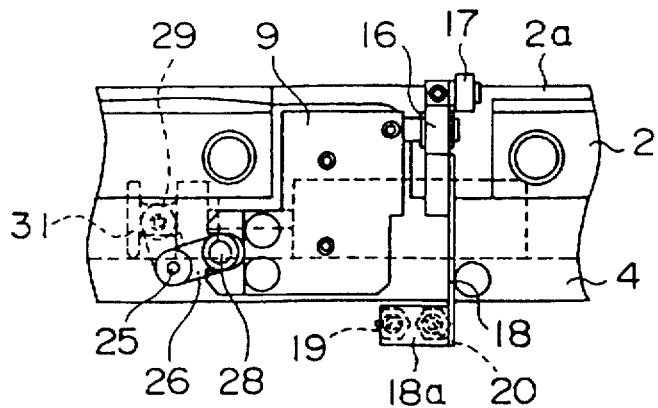
Figure 2:
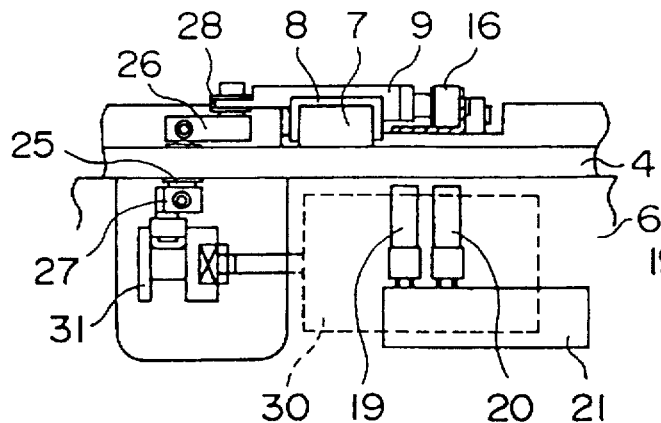
Figure 2:
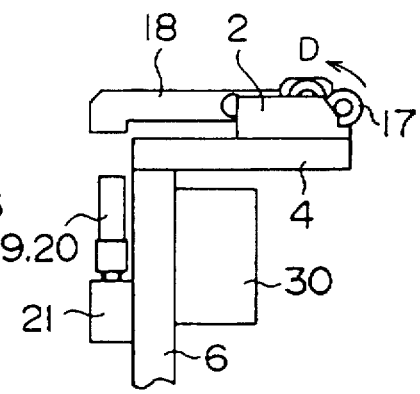
Figure 3:
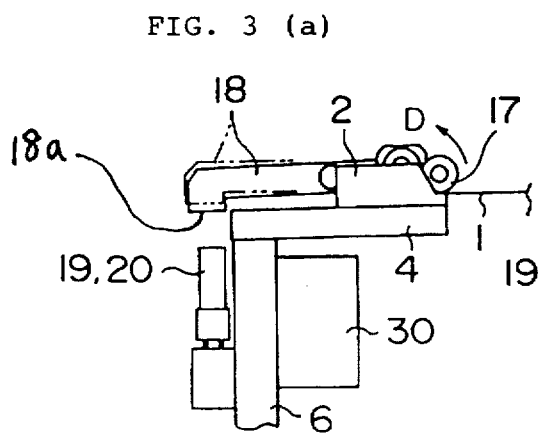
Figure 3:
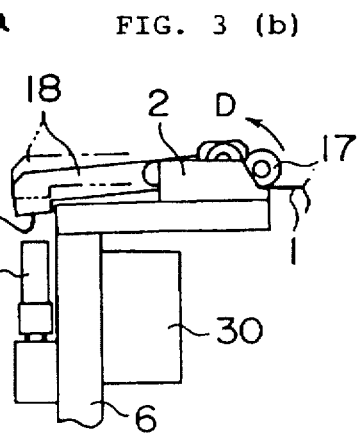

Embodiments of the present invention will be described with reference to FIGS. 1 through 3.

As seen from FIGS. 1a, 1b and 1c, a pair of lead frame guide rails 2 and 3 are installed parallel so that the guide grooves 2a and 3a formed on the inner sides of the guide rails 2 and 3, respectively, face each other. The guide rails 2 and 3 are fixed to the surfaces of respective rail supporting plates 4 and 5, and the rail supporting plate 4 is fastened to a side plate 6 of the lead frame transfer device.

A cut-out area 2b and a flat surface 2c, which is on the same plane as or flush with the guide groove 2a, are formed on the outer side of one of two lead frame guide rails 2. More specifically, the cut-out area 2b and the flat surface 2c are formed at a point of the outer side of the rail 2 where the lead frame 1 is moved on the rails 2 and 3 by a vacuum chucking head (not shown).

A guide plate 7 which performs a guiding action in a direction perpendicular to the conveying direction A of the lead frames 1 (i.e., in a direction perpendicular to the length-wise direction of the guide groove 2a) is fastened to the rail supporting plate 4 so as to be located under the cut-out area 2b. A sliding guide 8 is slidably mounted on the guide plate 7, and a sliding table 9 is fastened to the sliding guide 8.

On this sliding table 9, a supporting shaft 15 is provided so that the supporting shaft 15 is located on the flat surface 2c side, and a contact assembly 16 is supported on the supporting shaft 15 so that the contact assembly 16 can pivot on the shaft 15. A guide groove contacting roller 17 is rotatably fastened to one end of the contact assembly 16 so that the roller 17 faces the guide groove 2a. The contact assembly 16 is urged by a spring (not shown) so as to be pressed against the guide groove 2a and flat surface 2c. In addition, a dog 18 which has a detection part 18a is fastened to another end of the contact assembly 16 so that the dog 18 is located on the opposite side of the contact assembly 16 from the guide groove 2a.

Two reflection type fiber sensors 19 and 20 are installed so that they are located beneath the detection part 18a of the dog 18. The fiber sensors 19 and 20 face the detection part 18a when the detection part 18a is in the position illustrated in FIG. 2 (or when lead frame detection is being conducted). These fiber sensors 19 and 20 are attached to a sensor attachment plate 21 which is fastened to the side plate 6. One of the fiber sensors 19 is set so that it detects either one lead frame or no lead frame on the lead frame guide rails 2 and 3, while the other fiber sensor 20 is set so that it detects either one lead frame or two or more lead frames on the lead frame guide rails 2 and 3.

Furthermore, a roller retaining cut-out 9a in the shape of a "U" is formed on one side (left side in FIG. 1a) of the sliding table 9. As best seen from FIG. 1b, a supporting shaft 25 is rotatably provided in a hole opened in the rail supporting plate 4 so that the shaft 25 is located next to (or left side in FIG. 1b) the roller retaining cut-out 9a. An upper lever 26 and a lower lever 27 are attached to the upper end and lower ends of the supporting shaft 25, respectively; and an upper roller 28 and a lower roller 29 are respectively provided on the upper and lower levers 26 and 27 in a rotatable fashion. The upper roller 28 is inserted into the roller retaining cut-out 9a. A horizontally installed air cylinder 30 is fastened to the side plate 6. A pin rod 31 that has a roller retaining groove 31a is fastened to the operation rod 30a of the air cylinder 30, and the lower roller 29 is inserted in a roller retaining groove 31a of the pin rod 31.

The operation will be described below.

Figure 1:
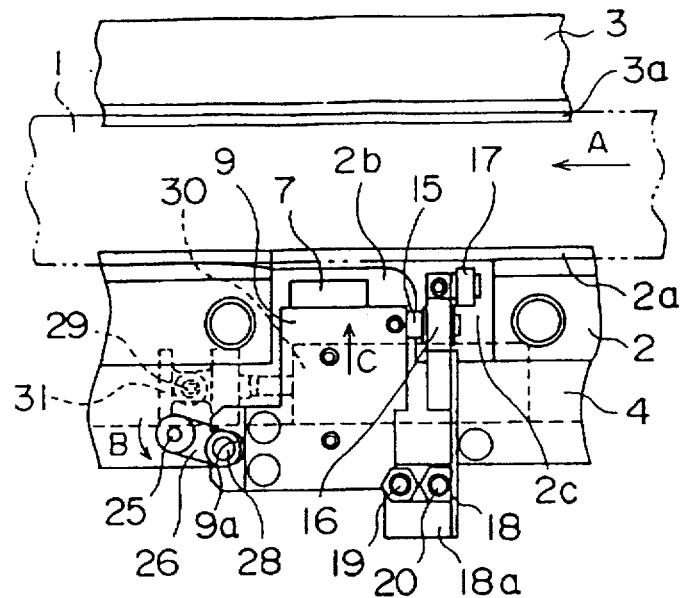
Figure 1:
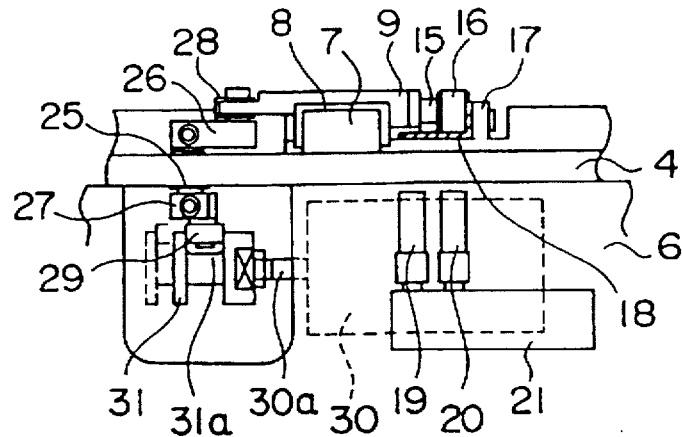
Figure 1:
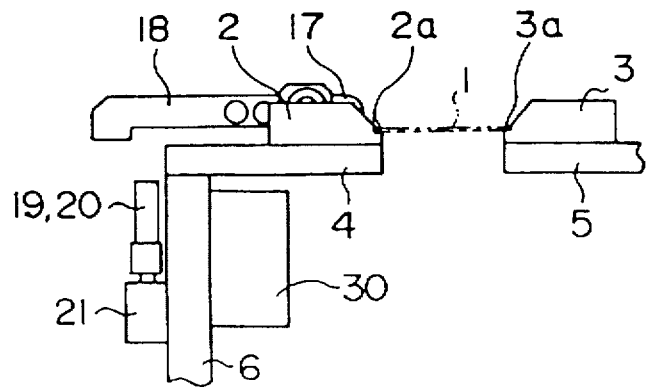

In the state shown in FIG. 1 wherein no lead frame is yet placed on the rails 2 and 3, the guide groove contacting roller 17 is in a waiting position (or home position). In other words, the roller 17 is withdrawn from the guide groove 2a and on the flat surface 2c of the guide rail 2 as best seen from FIG. 1c.

A lead frame 1 which is stacked with other lead frames in a lead frame magazine (not shown) is chucked by a vacuum chucking head (not shown) and is placed on the lead frame guide rails 2 and 3.

When the lead frame 1 is thus moved onto the guide rails 2 and 3, the operation rod 30a of the air cylinder 30 is actuated. As a result, the rod 30a moves outward (or moves toward left in FIG. 1b) by a signal which indicates the placement of the lead frame 1 on the lead frame guide rails 2 and 3, and the lower lever 27, supporting shaft 25 and upper lever 26 are rotated by the roller 29 in the direction indicated by arrow B in FIG. 1a about the supporting shaft 25. Thus, the sliding table 9 is moved by the upper roller 28 in the direction shown by arrow C.

When the guide table 7 is moved in the direction C, the guide groove contacting roller 17 rolls over the flat surface 2c and is, as best seen in FIG. 2a, moved onto the guide groove 2a of the lead frame guide rail 2. In this case, since the flat surface 2c and the guide groove 2a are on the same plane or they are flush with each other, the guide groove contacting roller 17 is pushed upward in the direction indicated by arrow D by the lead frame. In other words, the roller 17 is raised by an amount that corresponds to the thickness of one lead frame which is placed on the guide groove 2a as shown in FIG. 3a. Likewise, in cases where two lead frames are placed on the lead frame guide rails 2 and 3 one on the other, the guide groove contacting roller 17 is pushed upward in the direction shown by arrow D by an amount that corresponds to the thickness of two lead frames as shown in FIG. 3b, which is apparently larger than the amount of a single lead frame. In cases, however, where no lead frame is placed on the lead frame guide rails 2 and 3, the guide groove contacting roller does not move in the direction D at all as shown in FIG. 2c.

When the guide groove contacting roller 17 does not move in the direction D as shown in FIG. 2c, the position of the detection part 18a of the dog 18 remains unchanged.

On the other hand, as shown in FIGS. 3a and 3b, when the guide groove contacting roller 17 rotates in the direction D, the contact assembly 16 pivots about the supporting shaft 15; as a result, the detection part 18a of the dog 18 gets closer to the fiber sensors 19 and 20. In this case, when two stacked lead frames 1 are on the lead frame guide rails 2 and 3, as shown in FIG. 3b, the amount by which the contact assembly 16 pivots is greater than when a single lead frame 1 is on the lead frame guide rails 2 and 3 as shown in FIG. 3a; as a result, the detection part 18a of the dog 18 moves towards the fiber sensors 19 and 20 more closely.

Accordingly, since the detection position of the fiber sensor 19 is set so that the sensor 19 detects the detection part 18a of the dog 18 moved to the position indicated by the solid line in FIG. 3a, the fiber sensor 19 detects either that there is no lead frame present on the lead frame guide rails or that there is one single lead frame present on the lead frame guide rails. On the other hand, since the detection position of the fiber sensor 20 is set so that the sensor 20 detects the detection part 18a of the dog 18 moved to the position indicated by the solid line in FIG. 3b, the fiber sensor 20 detects two lead frames present on the lead frame guide rails.

After the lead frame(s) 1 have been thus detected, the operation rod 30a of the air cylinder 30 is retracted, and the sliding table 9 and guide groove contacting roller 17 are withdrawn from the guide groove 2a.

If no lead frame 1 was detected on the lead frame guide rails, the operation which supplies a lead frame 1 to the lead frame guide rails 2 and 3 is started. If, on the other hand, one lead frame 1 is detected on the lead frame guide rails, the lead frame 1 is fed to the bonding position of a bonding machine by a pusher or feeding pawls (not shown). In cases where two (or more) lead frames 1 are detected on the lead frame guide rails, the lead frame transfer device is stopped, the lead frames 1 on the lead frame guide rails 2 and 3 are removed, and then a start button of the lead frame transfer device is actuated.

As seen from the above, the guide groove contacting roller 17 of the contact assembly 16 is installed where the lead frames are first moved from the lead frame magazine and outside the guide groove 2a so that the roller 17 can advance to and withdraw from the guide groove 2a. Accordingly, the lead frames 1 can be detected before feeding the lead frames 1 along the lead frame guide rails 2 and 3 to the bonding machine. In cases where two lead frames 1 are detected and it is necessary to remove them, they are removed after letting the guide groove contacting roller 17 be withdrawn from the guide groove 2a, i.e., in a state in which the guide groove contacting roller 17 is not present above the lead frames 1. Accordingly, the lead frames 1 can easily be removed by merely lifting them.

In the embodiment described above, the reflection type fiber sensors 19 and 20 are used. However, it is possible to use transmission type sensors as disclosed in Japanese Patent Application Laid-Open (Kokai) No. 55-12747 and Japanese Utility Model Application Publication (Kokoku) No. 2-22987, etc. In such a case, the detection part 18a can be eliminated, and the lowered position of the end portion of the dog 18 is detected by the transmission type sensors.

As seen from the above, according to the present invention, the guide groove contacting part of the contact assembly advances to the guide groove from the outside of the guide groove and then withdraws from the advanced point. Thus, the separation of lead frames or the absence thereof can be detected before feeding the lead frames along the lead frame guide rails to a bonding machine; and in addition, if two or more lead frames are placed on the lead frame guide rails one on the other, those lead frames can be quickly removed.

We claim:

1. A lead frame detection device comprising a contact assembly which is biased towards a surface of one of two guide grooves of lead frame guide rails of a lead frame feeding apparatus which feed lead frames and a sensor means for distinguishing differences in an amount of movement of said contact assembly in accordance with a number of lead frames present on said lead frame guide rails, wherein a guide groove contacting part of said contact assembly is provided so as to advance onto one of said two guide grooves and to withdraw off of said one of said two guide grooves and said sensor means distinguishes said differences when said lead frames are present; whereby the number of lead frames on said lead frame guide rails is determined.

2. A lead frame distinguishing device according to claim 1, said device further comprising:
    a sliding table which is installed adjacent said one of said two guide grooves of said lead frame guide rails, said sliding table being able to move in a direction transverse to said one of said two guide grooves; and
    a driving means for causing said sliding table to advance onto or withdraw from one of said two guide grooves in said transverse direction; and wherein
    said contact assembly is pivotally supported on said sliding table so that said contact assembly pivots about a supporting shaft and said contact assembly is biased against said one of said two guide grooves.

* * * * *

UNITED STATES PATENT AND TRADEMARK OFFICE
CERTIFICATE OF CORRECTION

PATENT NO. : 5,741, 988
DATED : April 21, 1998
INVENTOR(S) : Eiji Kikuchi, et al.

It is certified that error appears in the above-indentified patent and that said Letters Patent is hereby corrected as shown below:

ON THE TITLE PAGE:

Item [54] Title of Invention:

Change "Lead Frame Detection Apparatus" to
--Lead Frame Detection Device--

Signed and Sealed this

Seventh Day of July, 1998

Attest:

BRUCE LEHMAN

Attesting Officer          Commissioner of Patents and Trademarks